United States Patent
Hagihara et al.

(10) Patent No.: US 6,344,752 B1
(45) Date of Patent: Feb. 5, 2002

(54) CONTACTOR AND PRODUCTION METHOD FOR CONTRACTOR

(75) Inventors: Junichi Hagihara, Sendai; Shinji Iino, Kitakoma-gun, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/509,546

(22) PCT Filed: Jul. 29, 1999

(86) PCT No.: PCT/JP99/04090
§ 371 Date: Apr. 12, 2000
§ 102(e) Date: Apr. 12, 2000

(87) PCT Pub. No.: WO00/10016
PCT Pub. Date: Feb. 24, 2000

(30) Foreign Application Priority Data

Aug. 12, 1998 (JP) ............................................. 10-241036
Aug. 12, 1998 (JP) ............................................. 10-241037

(51) Int. Cl.⁷ ............................................. G01R 31/02
(52) U.S. Cl. ........................................ 324/754; 324/762
(58) Field of Search ................................. 324/754, 757, 324/761, 762, 73.1, 758, 765, 72.5; 439/482

(56) References Cited

U.S. PATENT DOCUMENTS

| | | | |
|---|---|---|---|
| 5,177,438 A | * 1/1993 | Littlebury et al. | .......... 324/754 |
| 5,476,211 A | 12/1995 | Khandros | |
| 5,625,298 A | 4/1997 | Hirano et al. | |
| 5,811,982 A | * 9/1998 | Beaman et al. | ............. 324/762 |
| 5,828,226 A | 10/1998 | Higgins et al. | |
| 5,832,601 A | 11/1998 | Eldridge et al. | |
| 6,218,203 B1 | * 4/2001 | Khoury et al. | ................. 438/15 |

FOREIGN PATENT DOCUMENTS

| | | |
|---|---|---|
| JP | 7-283280 | 10/1995 |
| JP | 8-50146 | 2/1996 |
| JP | 9-148389 | 6/1997 |
| JP | 11-133062 | 5/1999 |
| JP | 11-145172 | 5/1999 |

\* cited by examiner

Primary Examiner—Ernest Karlsen
Assistant Examiner—Minh N. Tang
(74) Attorney, Agent, or Firm—Oblon, Spivak, McClelland, Maier & Neustadt, P.C.

(57) ABSTRACT

A conventional probe card is very complex in a support structure of probe terminals and it has been difficult to change an array of the probe terminals correspondingly to various arrays of electrode pads of an object to be checked. A contactor (1) of the present invention simultaneously sets its probe terminals in contact with a plurality of electrode pads of an object to be checked and electrical checking of the object is made once or a plurality of times. It has a plurality of first electrodes (3) arranged on a first substrate (silicon substrate) (2) and probe terminals (4) respectively provided on these electrodes (3). The probe terminal (4) has a conductive support (7) provided on the first electrode, elastic support plate (8) whose one end is fixed to the upper end of the conductive support column (7), and probe terminal (bump) 9 fixed to the free end portion of the elastic support plate (8).

21 Claims, 8 Drawing Sheets

CONTACTOR AND PRODUCTION METHOD FOR CONTRACTOR

TECHNICAL FIELD

The Present invention relates to a contactor used in checking the electrical characteristic of an object to be checked. In particular, the present invention relates to a contactor used in checking the electrical characteristics of a plurality of semiconductor elements formed on a semiconductor wafer.

BACKGROUND ART

As a contactor used in checking the electrical characteristics of a larger number of IC chips of a memory circuit, logic circuit, etc., formed on, for example, a semiconductor wafer (hereinafter referred to simply as a wafer), use is made of a probe card. The probe card has a plurality of probe terminals (for example, probe needles, bumps) corresponding to a plurality of electrode pads formed on, for example, an IC chip. The probe card has its probe terminals set in contact with electrode pads of an object to be checked and, by doing so, it serves as a relay for transmitting and receiving checking signals between a testing apparatus and the object to be checked.

In a recent time, the integration degree of the IC chip becomes higher and higher and electrode pads are rapidly increasing in number and are becoming narrower and narrower in pitch. With this, the probe needles of the probe cards are increasing in number and the probe terminals are becoming narrower and narrower in pitch. Further, with an increasing size of the wafer, the number of IC chips in the wafer is rapidly increasing. A longer time is necessary to check all the IC chips formed on a single wafer and an important task is to reduce a checking time involved. Even in the checking made by the probe card, the IC chips are not checked on one-by-one basis, but a plurality of IC chips formed on the single wafer are checked at a time or all the IC chips formed on the single wafer are checked at a time, thus reducing the checking time.

DISCLOSURE OF INVENTION

In a conventional probe card, a plurality of probe terminals are supported at one-end sides and, in the case where electrode pads on an object (IC chip) to be checked are arranged in a plurality of arrays, a support structure of those probe terminals corresponding to this arrangement becomes very complicated. It has been difficult to change an array of probe needles in a manner to correspond to various arrays of electrode pads on the IC chip and there raised the problems such that the freedom with which the probe needles were arranged was low and the tip positions of the probe needles were liable to be set wrong due to a thermal influence at a time of checking.

The present invention solves the above-mentioned tasks. The present invention can ensure a higher degree of freedom with which the probe terminals are arranged. According to the present invention, the probe terminals can be easily so arranged as to correspond to any electrode array of the object to be checked, and a plurality of elements formed on the object can be checked at a time. According to the present invention it is possible to lessen the thermal Ad influence and set the electrodes of the object and probe terminals of the contactor in an accurate and positive contact way.

In a first aspect of the present invention, there is provided a contactor comprising a first substrate, a plurality of first electrodes arranged in one surface of the first substrate, a plurality of probe terminals provided on the first electrode and making electrical contact with each of a plurality of checking electrodes of an object to be checked, the contact terminal having at least one conductive support mounted upright with a predetermined aspect ratio, a conductive elastic support plate whose one end is fixed to that end of the conductive support which is opposite to the first electrode and a contact terminal provided on the other end of the elastic support plate, a plurality of second electrodes arranged on the other surface of the first substrate, a first connection line electrically connecting, in the first substrate, each of the first electrode to each of the second electrode, and electrical connection means connecting each of the second electrodes to a testing apparatus.

Further, in this contactor, it is preferable that the aspect ratio of the conductive support be 2 to 20.

Further, in this contactor, it is preferable that the conductive support be comprised of a structure of a triangular prism.

Further, preferably, the elastic support plate has two plates arranged in a spaced-apart way and a connection plate connecting together one-end sides of these two plates, those free ends of the two plates of the elastic support plates which are not connected by the connection plate are fixed to the conductive support, and a contact terminal is provided at a substantially middle of the connection plate of the elastic support plate.

Further, preferably, in this contactor, the elastic support plate has a substantially square frame-like plate and a bridge-like plate provided at a diagonal line of the frame, the frame-like plate is fixed to the conductive support at corners on the diagonal line, and the contact terminal is provided at a substantially middle of the bridge-like plate.

Further, preferably, in this contactor, the elastic support plate has a substantially square frame-like plate and two cantilever-like beams extending from the two corners on the diagonal line of the frame and having free ends facing each other in a space-apart way, the frame-like plate is fixed to the conductive support at the corners on the diagonal line and two contact terminals are provided such that the free ends of the cantilever-like beams are arranged opposite to each other with a spacing provided.

Further, preferably, in this contactor, electrical connection means connecting each of the second electrodes to a testing apparatus has a second substrate and third electrodes provided on one surface of the second substrate and elastically and electrically contacted with the second electrode.

Further, preferably, in this contactor, the second substrate is comprised of a printed board.

Further, preferably, in this contactor, the plurality of first electrodes are arranged at a central area of one surface of the first substrate.

Further, preferably, in this contactor, the plurality of first electrodes are so provided as to correspond to all of a plurality of checking electrodes of the object to be checked.

Further, preferably, in this contactor, the plurality of second electrodes are arranged at a peripheral area on the other surface of the first substrate.

Further, preferably, in this contactor, the contact terminal is comprised of a bump having a flat surface at a forward end and gradually increased in wideness from the forward end toward a base section.

Further, preferably, in this contactor, the probe terminal is cylindrical in configuration.

In a second aspect of the present invention, there is provided a contactor comprising a first substrate, a plurality of first electrodes arranged on one surface of the first substrate, a plurality of probe terminals respectively provided on the first electrodes and making electrical contact with each of a plurality of checking electrodes of an object to be checked, the probe terminal having at least one conductive support mounted upright on the respective first electrode with a predetermined aspect ratio, a conductive elastic support plate whose one end is fixed to that end of the conductive support which is opposite to the first electrode, and a contact terminal formed over the first substrate and provided on the other end of the elastic support plate, a latching member provided on the first substrate to restrict an access distance of the elastic support plate to the first substrate side, a plurality of second electrodes arranged on the other surface of the first substrate, a first connection line electrically connecting, in the first substrate, each of the first electrodes to each of the second electrodes, and electrical connection means connecting each of the second electrodes to a testing apparatus.

Further, preferably, in this contactor, the aspect ratio of the conductive support is 2 to 20.

Further, preferably, in this contactor, the elastic support plate has two plates arranged in a spaced-apart way and a connection plate connecting together one-end sides of these two plates, free ends of the two plates of the elastic support plate which are not connected by the connection plate are fixed to the conductive support and the contact terminal is provided at a substantially middle of the connection plate of the elastic support plate.

Further, preferably, in this contactor, the elastic support plate has a substantially square frame-like plate and a bridge-like provided on a diagonal line of the frame, the frame-like plate is fixed to conductive supports at corners on a diagonal line and the contact terminal is provided at a substantially the middle of the bridge-like plate.

Further, preferably, in the contactor, the elastic support plate has a substantially square frame-like plate and two cantilever-like beams extending from two corners on the diagonal line of the frame onto the diagonal line and having free ends arranged opposite to each other with a clearance provided, the frame-like plate is fixed to the conductive support at corners on the diagonal line, ant two contact terminals are provided at the respective free ends of the cantilever-like beams in a mutually opposite way with a spacing provided.

Further, preferably, in this contactor, the electrical connection means connecting each of the second electrodes to a testing apparatus has a second substrate and third electrodes provided on one surface of the second substrate and having elastic connection members elastically and electrically contacted with the second electrodes.

In a third aspect of the present invention, there is provided a method for manufacturing a contactor with the use of a processing technique having the steps of coating a resist film on a predetermined surface, exposing the resist film with light, etching the exposed portion of the resist film to form an opening in the resist film, and performing a predetermined process on the opening, comprising the step of forming a plurality of said first electrodes on the first substrate; the step of forming the conductive support on each of the first electrodes, as a resist in the step of forming the conductive support use being made of a transparent resist material so as to form the conductive support of a predetermined aspect ratio; the step of forming the conductive elastic support plate whose one end is fixed to an end opposite to the first electrode side of each of the conductive supports; and the step of forming the contact terminal on the other end of the elastic support plate.

In a fourth aspect of the present invention there is provided a method of manufacturing the contactor with the use of a processing technique having the steps of coating a resist film on a predetermined surface, exposing the resist film with light, etching the exposed portion of the resist film to form an opening in the resist film, and performing a predetermined processing on the opening, comprising the step of forming a plurality of said first electrodes on the first substrate; the step of forming the conductive support and latching member on each of said first electrodes, as a resist material in the step of forming the conductive support and latching member use being made of a transparent resist material so as to form the conductive support of a predetermined aspect ratio; the step of forming the conductive elastic support plate whose one end is fixed to an end opposite to the first electrode side of each of the conductive supports; and the step of forming the contact terminal on the other end of the elastic support plate.

BEST MODE OF CARRYING OUT THE INVENTION

The present invention will be explained below on the basis of a first embodiment shown in FIGS. 1 to 6. The present invention relates to a contactor usable in checking the electrical characteristics of a to-be-checked object having electrode pads for checking. As this object, there are a plurality of IC chips formed on a semiconductor wafer, various kinds of electrical components and electrical products such as a liquid crystal. Here, an explanation will be made about a case where a plurality of IC chips formed on the semiconductor wafer are taken as the object to be checked.

Figure 1:
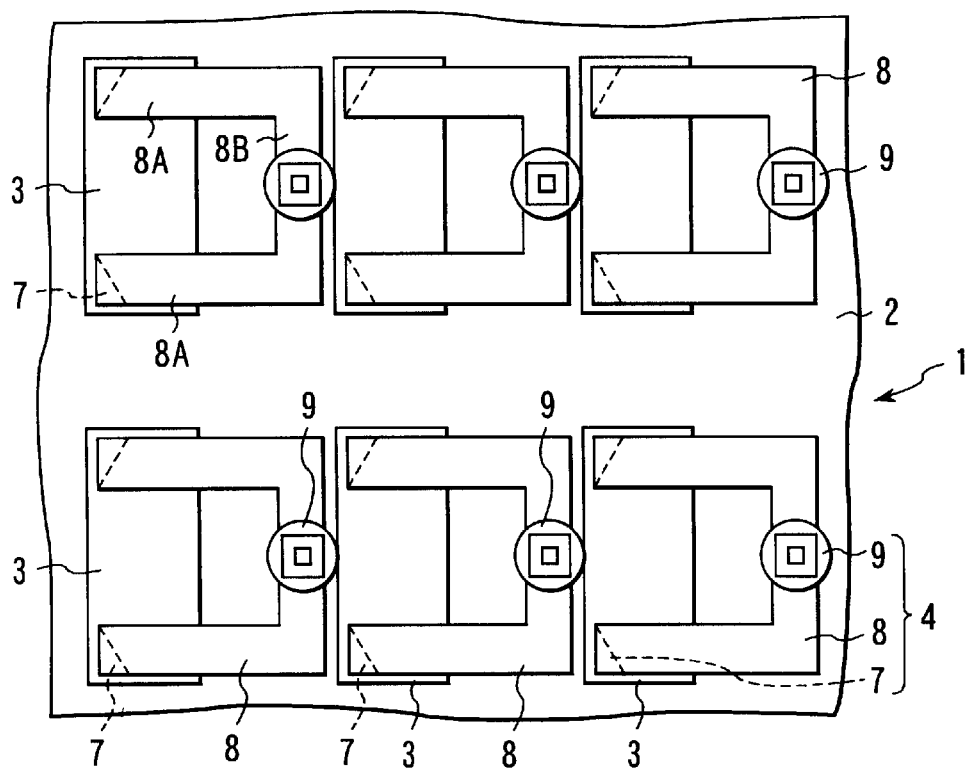
FIG. 1 is a plan view showing a major section, as an expanded section, showing one embodiment of a contactor of the present invention.
Figure 2:
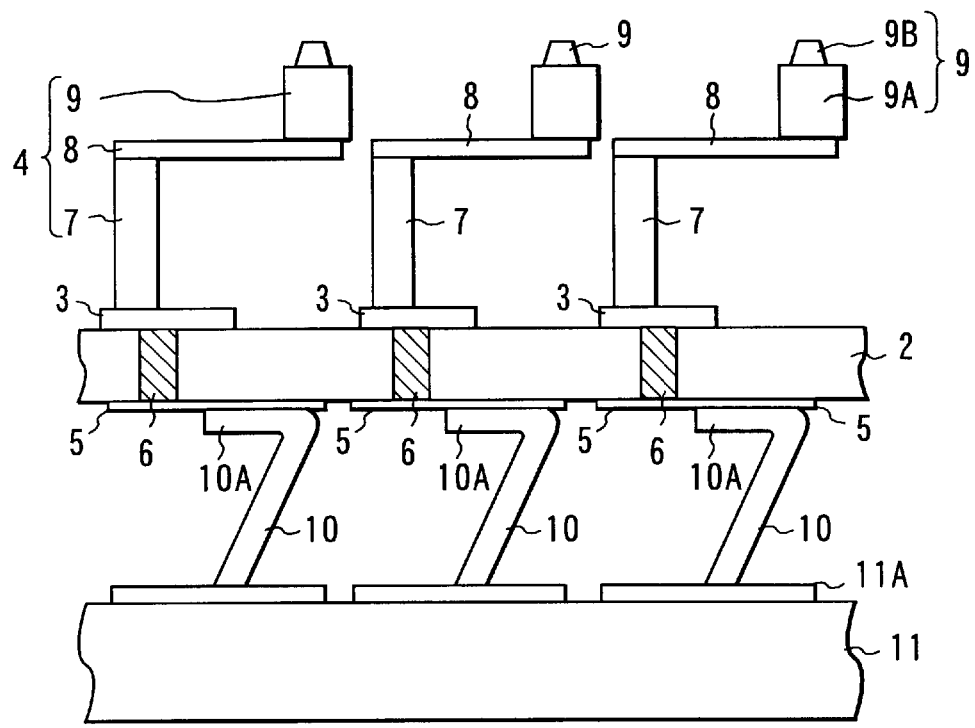
FIG. 2 is a side view of the contactor shown in FIG. 1.

The contactor of the present embodiment is shown in FIGS. 1 and 2. As a first substrate 2 having a size substantially equal to the object (wafer) to be checked a silicon substrate 2 can be adopted. First electrodes 3 are arranged over a whole surface of the first substrate 2 to correspond to a plurality of checking electrode pads of the object. As an array of the first electrodes, for example, a matrix array can be adopted. The respective first electrode 3 can be made rectangular in configuration and be made of an conductive metal (nickel, nickel alloy, for example).

A conductive support 7 is mounted upright on the respective first electrode 3. It is preferable that the conductive support 7 have a predetermined aspect ratio. Preferably, the aspect ratio has a value such that an elastic support plate 8 as will be set out below can operate exactly. Stated in more detail, the aspect ratio can be made to have a value of 2 to 20, more preferably, 4 to 6. Further, the conductive support 7 can be made to have various kinds of structures, such as a circular cylinder, quadrangular prism, triangular prism and conical column. In FIG. 11 the conductive support 7 is shown to have a triangular prism.

The elastic support plate 8 is fixed on a side of the conductive support 7 opposite to the first electrode. The elastic support plate may take any structure if, with its end fixed to the conductive support 7 as a base end, its free end can move in up/down motion while having a predetermined elasticity. FIG. 1 shows a U-shaped structure by way of example.

In FIGS. 1 and 2, a pair of conductive supports 7 of the same height are mounted upright at opposite corners of the surface of the first electrode 3. The elastic support plate (cantilever spring, for example) 8 is fixed to the upper end of the respective conductive support 7 and has a U-shaped flat configuration. The U-shaped cantilever spring 8 comprises two spaced-apart plates 8A and a connection plate 8B connecting together one-end sides of these two plates. The cantilever spring 8 is supported on the upper end of the conductive support 7 in a horizontally cantilevered way. The flat configuration of the cantilever spring 8 can be so formed as to have various e configurations including not only the U-shaped configuration but also a dog-logged, semicircular configuration, etc.

The respective base end portions of the two plates 8A of the elastic support plate 8 are fixed to the upper ends of paired conductive supports 7 and a contact terminal 9 is provided on the connection plate 8B. The contact terminal 9 may be comprised of a bump 9. As shown in FIGS. 1 and 2, the bump 9 has a substantially cylindrical section 9A and a frusto-pyramidal section 9B serving as an electrical contact section. The elastic support plate 8 can be made of a conductive metal (such as nickel and nickel-cobalt alloy) of elasticity and toughness. The cylindrical section 9A of the bump 9 can be made of the same conductive metal as that of, for example, the cantilever 8. The frusto-pyramidal section 9B can be made of a conductive metal material (such as tungsten carbide) higher in hardness than the electrode pad of the chip. The surface of a probe terminal 4 can be coated with a metal of better conductivity, such as gold, rhodium or these alloys.

Second electrodes 5 are provided on the rear surface of the silicon substrate 2. The second electrode 5 can be made of a conductive metal of the same kind as that of the first electrode 3. The first electrode 3 and second electrode 5 are electrically connected to each other by a first connection line (connection conductor) 6.

The bumps 9 of the respective probe terminals 4 thus structured are contacted one at a time with checking electrode pads (the checking electrodes of all the chips or checking electrodes of given chips) made of a conductive metal (such as aluminum or copper), that is, with checking electrode pads of the object (for example, a plurality of chips formed on a wafer W). The bump 9 is electrically connected to the second electrode 5 through the elastic support plate 8, conductive support 7, first electrode 3 and first connection line 6.

When the contactor 1 is contacted with the wafer W and bumps 9 are contacted with the electrode pads of the chips on the wafer W, the bumps 9 are pushed against the electrode pads under an elastic force of the elastic support plate 8. Under this elasticity, the bumps 9 and electrode pads are electrically connected together in a positive way and a variation in height among the electrode pads or bumps is absorbed.

Figure 10:
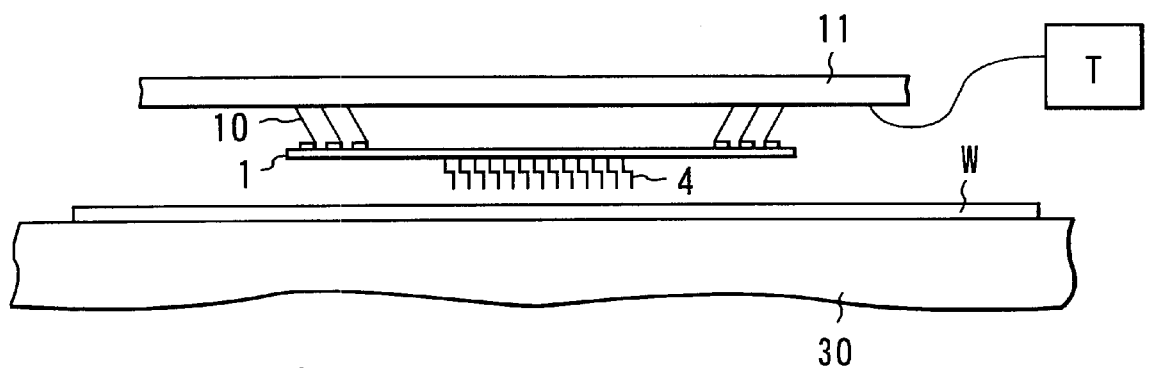
FIG. 10 is a view for explaining a situation in which the contactor of the present invention is utilized.
Figure 11A:
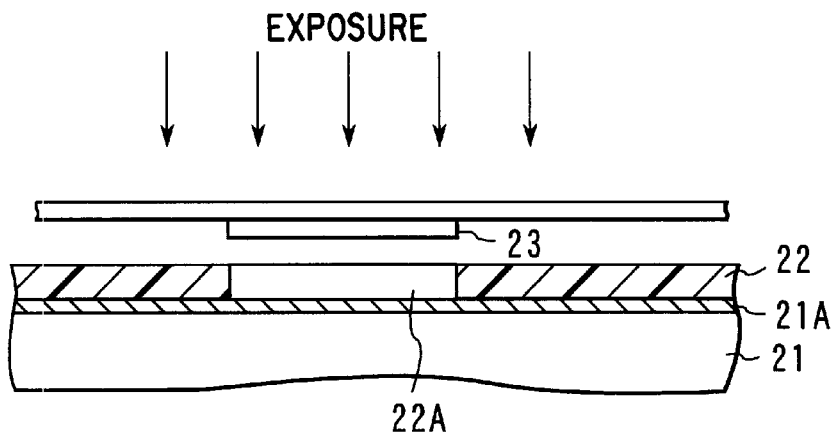
FIGS. 11A, 11B, 11C and 11D are views showing the steps of manufacturing the bump portion of a probe terminal shown in FIG. 8.
Figure 11B:
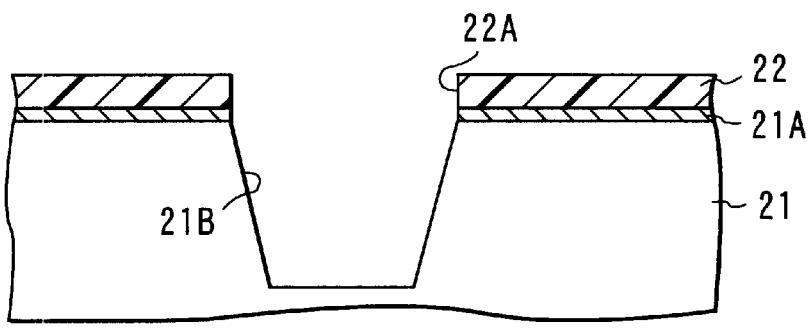
Figure 11C:
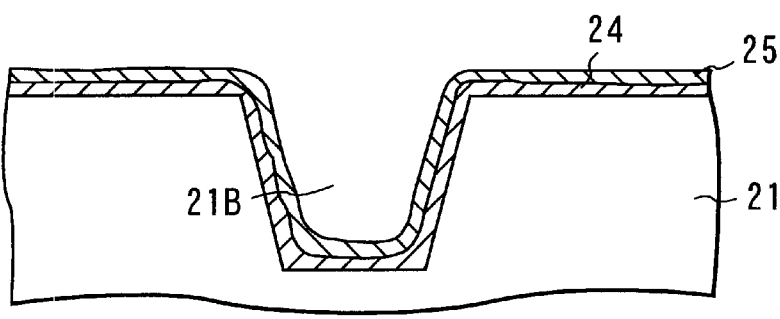
Figure 11D:
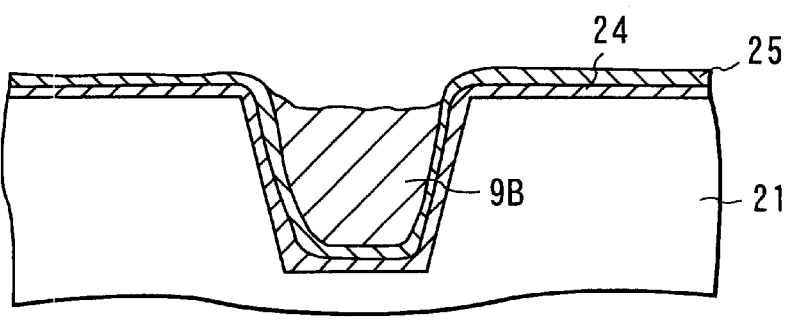

As shown in FIG. 2, an electrical connection means is provided on the rear surface side of the first substrate (silicon substrate) 2 to allow the contactor 1 to be connected to a testing apparatus T (see FIG. 10). The example of this electrical connection means is shown in FIG. 2. In FIG. 2, the electrical connection means includes a second substrate 11, third electrodes 11A and elastic connection members 10 mounted on the third electrodes 11A. The third electrodes 11A are connected to the testing apparatus T through connection lines (not shown) provided at the upper surface or the lower surface of the second substrate 11. It is preferable that the second substrate 11 be comprised of a performance board or printed wiring board. Preferable, the elastic connection member 10 is comprised of a ribbon-like elastic body. This ribbon-like elastic body can be made of, for example, a gold alloy. Through the electrical connection means 11 the second electrodes are electrically connected to the testing apparatus, etc. The ribbon-like elastic connection member 10 has a bent surface 10A as shown in the Figure above. The bent surface 10A is set in electrical contact with, or electrically connected to, the second electrode 5 on the rear surface of the first substrate (silicon substrate) 2. The other end of the elastic connection member 10 is connected to the third electrode 11A on the second substrate (printed circuit board) 11. This elastic connection member 10 or its surface is formed of a conductive metal film (for example, nickel or nickel cobalt alloy) of elasticity and toughness.

A method of manufacturing a contact 1 of the present embodiment will be explained below while referring to FIGS. 3 and 4. This manufacturing method uses a LIGA (Lithographie, Galvanoformung, Abformung) process.

Figure 3A:
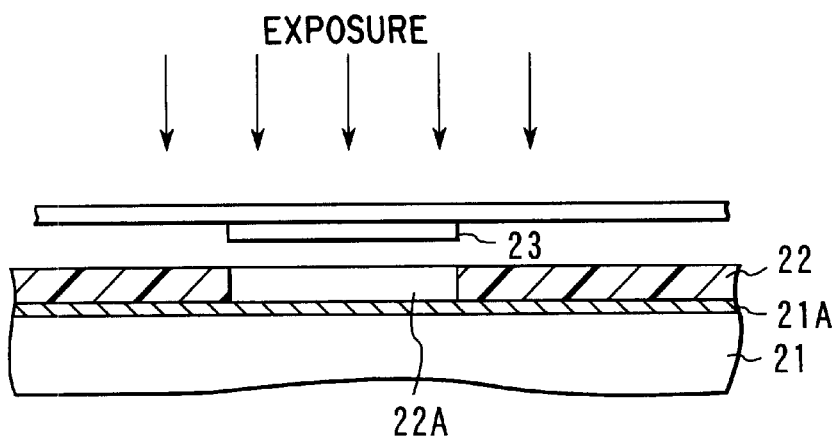
FIGS. 3A, 3B, 3C and 3D show the steps of manufacturing a bump portion of the probe terminal shown in FIG. 1.

First, as shown in FIG. 3A, a silicon oxide film 21A is formed on a silicon substrate 21 and a resist film 22 is formed on the oxide film 21A. The resist film 22 is exposed with light through a photomask 23 having openings corresponding to a pattern of probe terminals (bumps) 9.

Figure 3B:
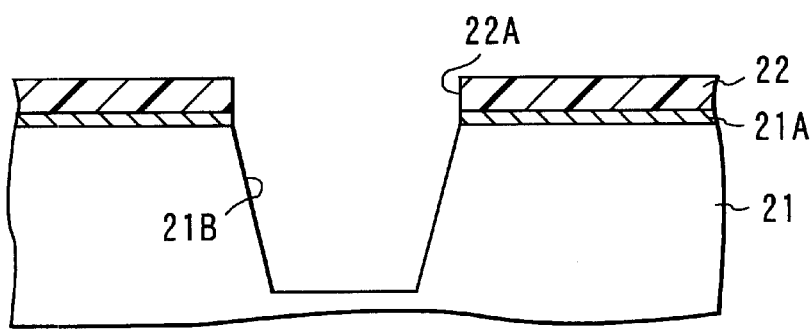

As shown in FIG. 3B, the resist film 22 is subjected to a developing process to form a square opening 22A in the resist film 22. The silicon oxide film 21A exposed in the opening 22A is eliminated. The silicon substrate 21 is subjected to an anisotropic etching to from an opening 21B of an inverted frusto-pyramidal configuration as shown in FIG. 3B. The resist film 22 and silicon oxide film 21A are removed.

Figure 3C:
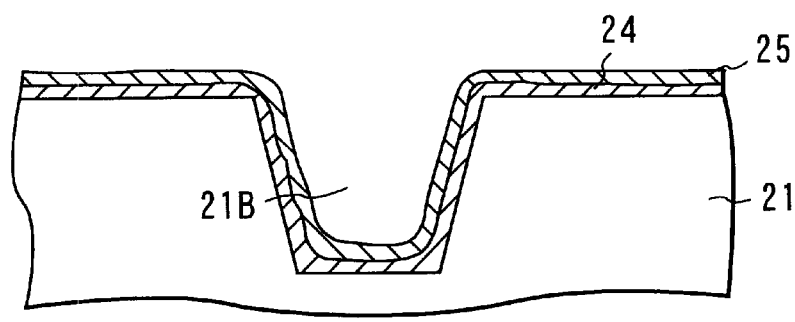

As shown in FIG. 3C, an oxide film 24 is formed on the silicon substrate 21. A titanium film 25 is formed on the oxide film 24 and a resist is coated on the titanium film 25. The resist film portion corresponding to the opening 21B is removed by an exposure with light and a developing process. By doing this process a the opening 21B is exposed.

Figure 3D:
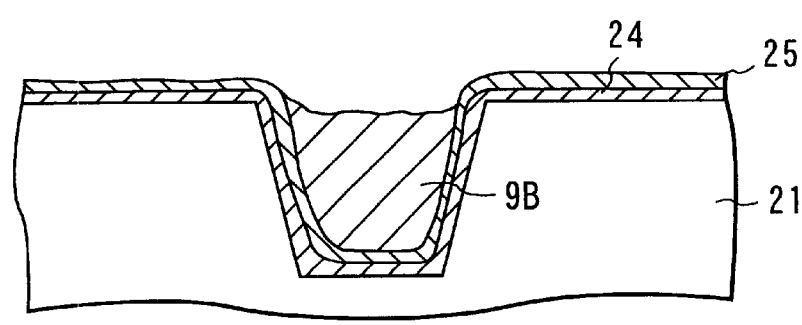

As shown in FIG. 3D, a material (for example, tungsten carbide-cobalt alloy) constituting a frusto-pyramidal portion of the bump is sputtered onto the silicon substrate 21. The opening 21B in the silicon substrate 21 is buried with the tungsten carbide-cobalt alloy to form a portion corresponding to the frusto-pyramidal section (contact section) 9B of the bump 9 of the probe terminal 4. The silicon oxide film 24 acts as an isolation layer for isolating the frusto-pyramidal section 9B of the bump 9 from the opening 21B of the silicon substrate 21. The silicon oxide film 24 can be replaced by a material performing the same function. The titanium film 25 serves as a barrier layer for preventing the diffusion of the tungsten carbide-cobalt alloy forming the frusto-pyramidal section 9B. This titanium film 25 may be replaced by other materials similarly serving as a barrier layer.

Figure 4A:
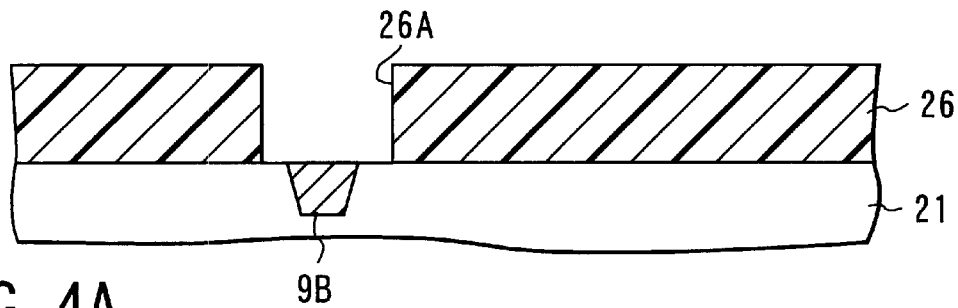
FIGS. 4A, 4B, 4C and 4D show the steps of manufacturing a portion other than the bump portion of the probe terminal shown in FIG. 1.

As shown in FIG. 4A, a sacrificial layer 26 is formed on the silicon substrate 21. The sacrificial layer 26 constitutes a temporary layer which can withstand a predetermined process and can be removed from on the silicon substrate 21 at a stage of completing the process. As this sacrificial layer a resist of high transparency is preferable. As this resist, use can be made of a resist containing a polymethylmethacrylate (PMMA). This sacrificial layer 26 is exposed with light and subjected to developing process and, by removing the sacrificial layer around the frusto-pyramidal section 9B of the bump 9, a hole 26A is formed. The configuration of this hole 26A can be so determined as to correspond to the cross-sectional configuration of a predetermined bump (for example, a circular or tetragonal configuration). By adopting a highly transparent PMMA as the sacrificial layer 26 an exposure light beam such as an x-ray can penetrate the sacrificial layer 26. By the ray penetration, it is possible to expose even the bottom portion of the thick sacrificial layer with the ray and to form a hole 26A of a higher aspect ratio.

Figure 4B:
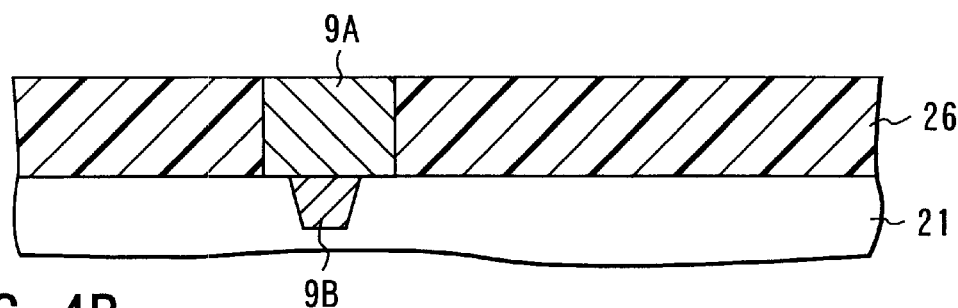

As shown in FIG. 4B, the hole 26A is buried with a predetermined metal by an electroforming process. This metal can be a metal constituting a cylindrical section 9A of the bump and, as such a metal, use can be made of, for example, a nickel alloy. An isolation layer of the titanium film is formed (not shown in the Figure) on the surface of the sacrificial layer 26 and on the surface of the cylindrical section 9A.

Figure 4C:
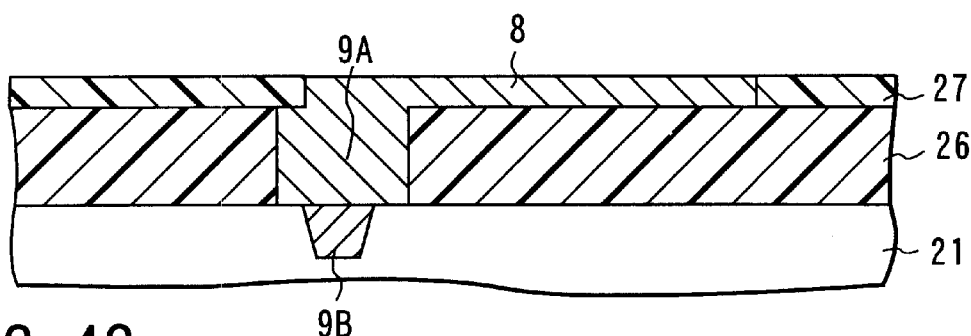

As shown in FIG. 4C, as set out above, a resist film is formed on the surface of the isolation layer of the titanium film. This resist film 27 is exposed with light and subjected to developing process, an opening is formed at a corresponding area of the cylindrical section 9A and the titanium film at that portion is removed by the etching process to expose a nickel alloy of the cylindrical section 9A. A resist containing a PMMA is coated on these surfaces and a sacrificial layer 27 is formed. This sacrificial layer 27 is exposed with light through a predetermined pattern and subjected to developing process and, by doing so, the sacrificial layer 27 is removed from those portions corresponding to the cylindrical section 9A and elastic support plate. A metal layer 8 of a predetermined metal is formed, by an electroforming process, in the recess formed by this removing step. As the metal of this metal layer 8 use is made of a material constituting the elastic support plate. For example, a nickel alloy may be adopted. This metal layer 8 constitutes an elastic support plate 8 and is formed integral with the cylindrical section 9A.

Figure 4D:
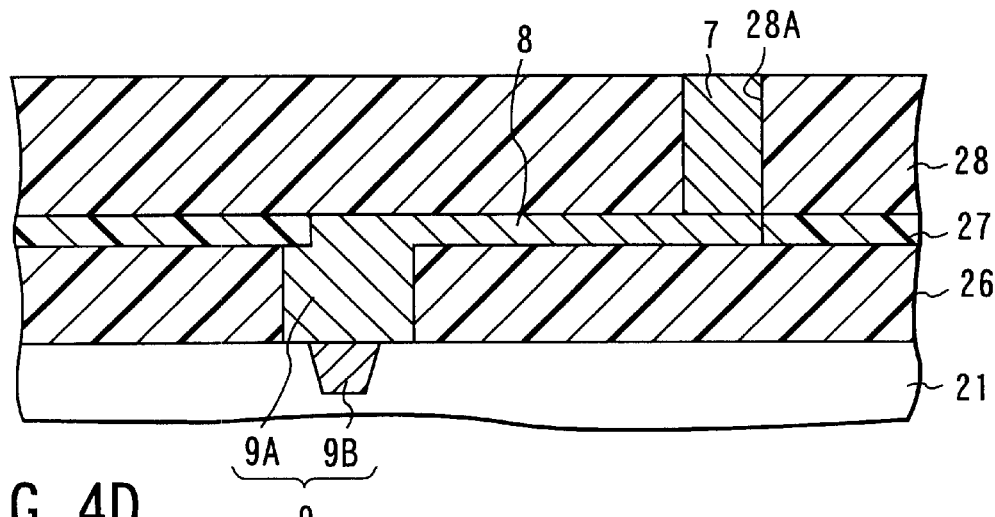

As shown in FIG. 4D, the same process as in FIG. 4C is performed and a sacrificial layer 28 made of the same material as the sacrificial layer 26 is formed and a cylindrical hole 28A is formed. A predetermined metal is buried in the cylindrical hole 28A. This metal provides a conductive support 7. Thus, this metal can be used as a material of which the conductive support 7 is made and may be, for example, a nickel alloy.

By the above process, a probe terminal 4 is formed in the sacrificial layers 26, 27, 28 over a silicon substrate 21. Then this silicon substrate 21 is joined to a first substrate (silicon substrate) 2 for a contactor (see FIG. 2). That is, a conductive support 7 is joined to a first electrode 3 of the first substrate 2. Then this integral unit is processed with a hydrofluoric acid, etc., and by doing so, the sacrificial layers 26, 27, 28 are removed.

The above process can be variously modified. For example, the first electrode 3, instead of being formed on the first substrate 2, can be formed on the conductive support 7 on the second substrate 21 subsequent to a step of FIG. 4D.

Then, by a bonding apparatus, an elastic connection member 10 is connected to a second electrode 5 on the first substrate 2. A material for a sacrificial layer is coated on the first substrate 2 and the elastic connection member 10 is buried in the sacrificial layer. As the material of the sacrificial layer a wax may be used. The surface of the sacrificial layer is polished and the free ends of a plurality of elastic connection members 10 are made to have the same height. The free ends of these elastic connection members 10 are connected to an electrode 11A of a second substrate (Here, a printed wiring board is used) 11 and the printed wiring board 11 and silicon substrate 2 are made to have an integral unit. Thereafter, the above-mentioned sacrificial layer (wax) is removed and a contactor 1 connected to the printed wiring board 11 is completed.

The operation of the contactor 1 will be explained below by taking an example of a case where the contactor 1 is mounted on a probe apparatus for a semiconductor wafer. In FIG. 10, a wafer w is placed on a stage movable in directions X, Y, Z and θ within the probe apparatus. The stage is moved to beneath the contactor 1. The stage is moved in the X, Y and θ directions by an aligning mechanism to set the respective electrode pads of the wafer W in a state aligned with the probe terminals 4. The stage is moved upward in the Z direction to allow contact to be made between the electrode pads formed on the IC chip on the wafer and the probe terminals 4 of the contactor 1. Further, by overdriving the stage in the Z direction, the probe terminals 4 are pushed by the electrode pads. At this time, the difference in height between the respective probe terminals and the respective electrode pads is absorbed by an elastic deformation of the elastic support plate 8 and/or conductive support 7. As a result, the bumps 9 of the probe terminals 4 make positive electrical contact with the electrode pads by the elastic forces of the elastic support plate 8 and conductive support 7. The IC chips formed on the semiconductor wafer are connected to the testing apparatus T all at a time or in plural units (for example, 32) and checked.

In the present embodiment, the contactor 1 and second substrate 11 are connected by the elastic connection member 10. For this reason, in addition to the probe terminals 4 and also by the elastic connection member 10, it is possible to absorb the difference in height between the electrode pads of the object to be checked and the probe terminals of the probe terminals 4. Further, it is also possible to impart a pushing force for setting the contact terminals 9 in pressure contact with the electrode pads. Further, if an in-line system is adopted by incorporating the probe apparatus with the contactor 1 of the present embodiment mounted thereon into the semiconductor manufacturing process, any defective products can be screened at an earlier stage of the process.

Figure 5A:
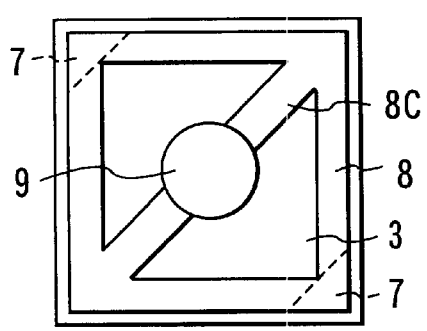
FIGS. 5A, and 5B are views showing a major section of another embodiment of a contactor of the present invention, FIG. 5A being a plan view and FIG. 5B being a side view of FIG. 5A.
Figure 5B:
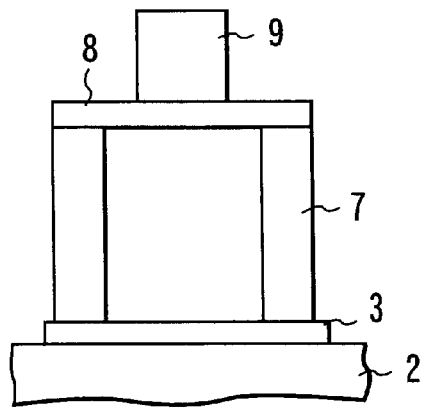
Figure 6A:
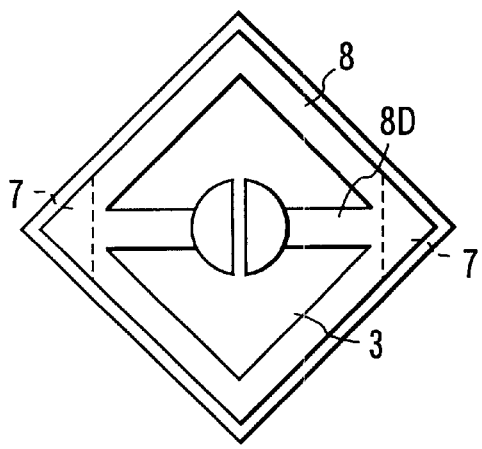
FIGS. 6A and 6B are views showing a major section of another embodiment of a contactor of the present invention, FIG. 6A being a plan view and FIG. 6B being a side view of FIG. 6A.
Figure 6B:
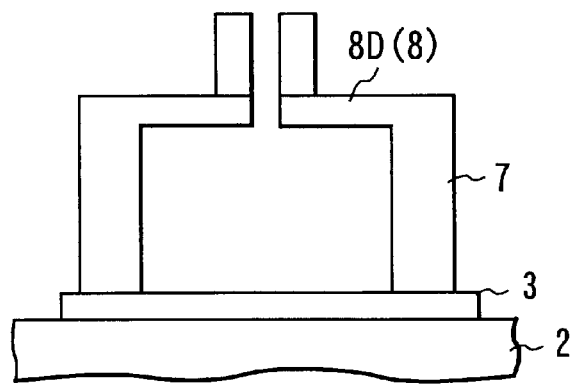

Another embodiment of the present invention will be explained below by referring to FIGS. 5 and 6. A contactor shown in FIGS. 5 and 6 is so constructed as to be basically the same as the above-mentioned embodiment but is different therefrom in terms of the structure of a probe terminal. The same reference numerals are employed in this embodiment to designate parts identical or corresponding to those of the above-mentioned embodiment.

A probe terminal 4 shown in FIG. 5 has a first electrode of a square configuration, one pair of conductive supports 7 mounted upright at the corners of a diagonal line on the first electrode 3, a substantially square frame-like elastic support plate 8 supported on the upper end of the conductive supports 7, a bridge-like plate (spanning section) 8C formed integral with the elastic support plate 8 on a diagonal line, and a bump 9 fixed to a middle area of the bridge-like plate 8C. As shown in FIG. 5, the bump 9 is so formed as to have a cylindrical configuration whose forward end is made flat.

Since the forward end of the probe terminal 4 is not pointed, even in the case where an electrode pad of an object to be checked is comprised of a solder bump, the probe terminal can make better electrical contact with the electrode pad. That is, the forward end of the bump 9 of the probe terminal 4 is made flat and, even if overdriving is done after the bump 9 makes contact with the solder bump of the object to be checked, the bump 9 is not bitten into the semiconductor bump. Further, even in the case where the heights of a plurality of solder bumps of the object to be checked differ, these height differences can be absorbed by an elastic deformation of the bridge-like plate 8C and conductive support 7. As a result, the forward end of the bump 9 of the probe terminal 4 makes better electrical face contact with the solder bump. Further, the bump 9 of the probe terminal 4 is vertically pushed against the solder bump and there is no damage to the solder bump. At a time of reflowing following the checking, a dust, etc., is prevented from intruding into the solder bump and the solder bump can maintain an initial form. In the case where the object to be checked is comprised of an IC chip, it is possible to provide this IC chip as a KGD for flip-chip mounting.

A probe terminal 4 shown in FIG. 6 may be used as an aluminum pad. This probe terminal 4 is such that a bridge-like plate of a support plate 8 is formed of one pair of cantilever-like beams (spring sections) 8D, 8D.

Between the forward ends of these cantilever-like beams 8D, 8D a slight clearance is created. A bump 9 is provided at the free ends of the cantilever-like beams 8D, 8D. The bump 9 can be made to have a quadrangular prism-like or cylindrical configuration. The bump 9 can be made to provide two split bumps 9A, 9A. When the bump 9 of the probe terminal 4 is set in contact with the electrode pad (for example, aluminum pad) of an object to be checked, the split bumps 9A, 9A are pushed toward a second electrode 3 side against an elastic force of the cantilever spring sections 8D, 8D. The split faces of the slit bumps 9A, 9A are contacted into one bump and make electrical contact with the aluminum pad.

In the above-mentioned embodiment, an explanation was made about the case where the probe terminal 4 was manufactured with a nickel base. The probe terminal can be made of a noble metal, such as palladium. In the above-mentioned embodiment, titanium was used as an isolation layer. In place of the titanium use can be made of silver, etc.

The bump shown in FIGS. 5 and 6 can be formed as a bump having the frusto-pyramidal section shown in FIGS. 1 and 2. The probe terminal 4 may be covered with an insulating film except the bump 9.

The configuration and array of the probe terminal are not restricted to those of the above-mentioned embodiment.

The cantilever spring 8 may take any shape and array capable of imparting an action of an elastic force.

Another embodiment of a contactor of the present invention will be explained below with reference to FIGS. 7 and 8.

Figure 8:
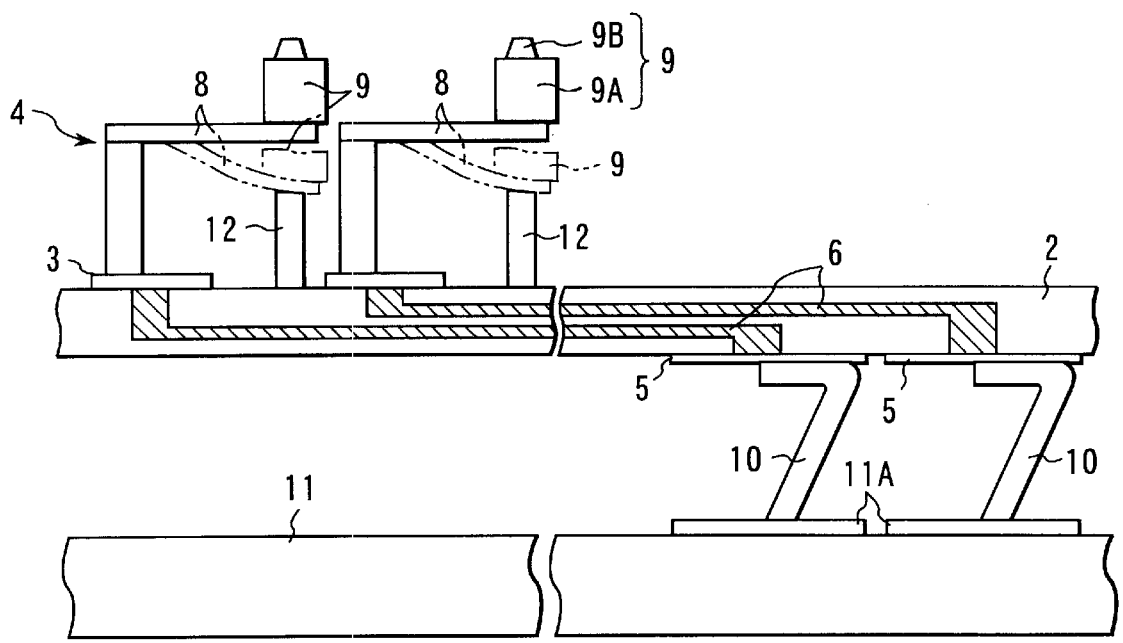
FIG. 8 is a side view showing the contactor shown in FIG. 7.
Figure 9A:
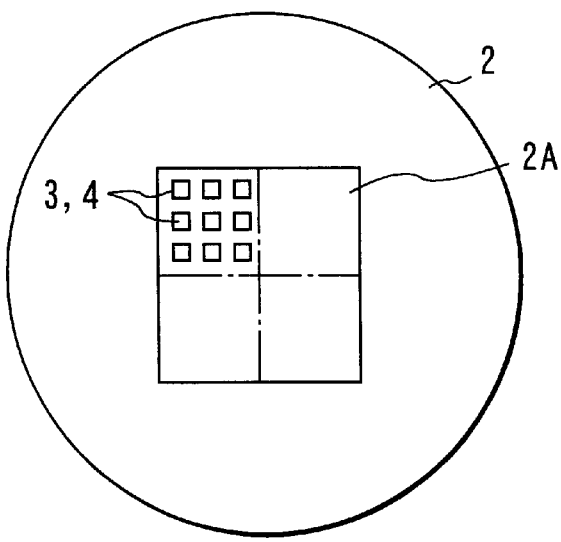
FIGS. 9A and 9B are views showing the surface of a contactor shown in FIG. 8, FIG. 9A showing a whole surface of the contactor and FIG. 9B showing a rear surface of the contactor.
Figure 9B:
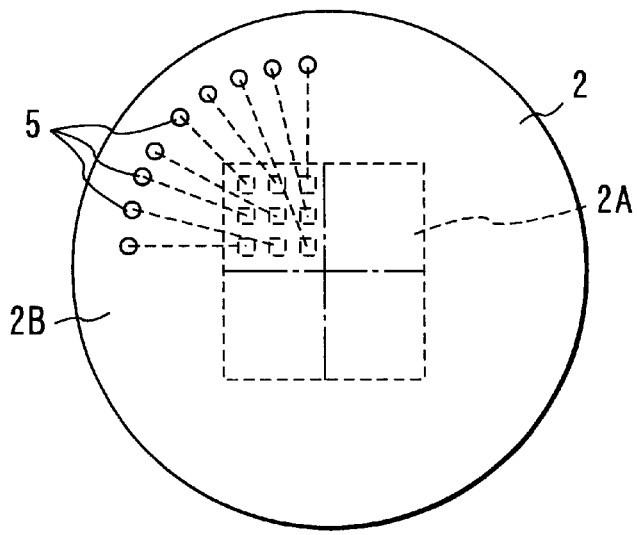

The contactor 1 of this embodiment has as shown in FIG. 8, a plurality of first electrodes 3 (the electrode may be made of a conductive metal, such as nickel or nickel alloy) arranged in a matrix array on a first substrate (for example, a silicon substrate) 2 and probe terminals 4 provided on the respective first electrodes 3. It is preferable that the first substrate be made to have a configuration (for example, a circular configuration) similar to an object to be checked. At a central area 2A on the first substrate 2, a plurality of probe terminals 4 are arranged in a square array and in a matrix array as shown in FIG. 9A. FIG. 9B shows a rear structure of the first substrate 2. At its peripheral edge portion 2B, second electrodes 5 are arranged in a circular array.

The second electrode 5 is electrically connected to the first electrode 3. Preferably this connection is made by an electrical connection line 6 (see FIG. 8) provided in the first substrate 2.

Figure 7:
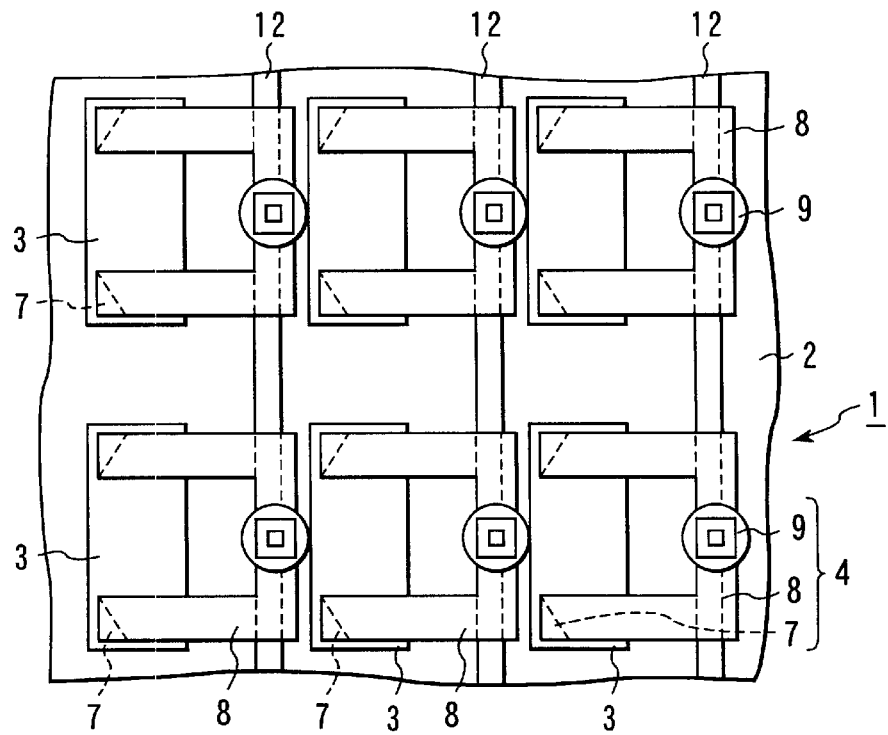
FIG. 7 is a plan view showing a major section, as an expanded section, showing another embodiment of the present invention.

The probe terminal 4 has, as shown in FIGS. 7 and 8, one pair of conductive supports 7 provided at two opposite corners of the first electrode 3, an elastic support plate (for example, a cantilever spring) 8 fixed to the upper end of the conductive support 7, and a bump 9 fixed to the free end portions of the elastic support plate 8. The flat configuration of the elastic support plate 8 is preferably U-shaped, but can be made to have various configurations, such as a dog-legged-like, circular arc-like and triangular configuration. The fixed ends (two mutually opposite base ends) of the elastic support plate 8 are fixed to the respective upper ends of the two conductive supports 7 in a freely conductive way.

A probe terminal (for example, a bump) 9 is fixed to a middle portion of the fee end of the elastic support plate 8. The bump 9 may be comprised of a support section 9A and contact section 9B as shown in FIG. 8. The support section 9A can be made substantially cylindrical in configuration. The contact section 9B can be made frusto-pyramidal. Preferably, the elastic support plate 8 is made of a conductive metal of elasticity and toughness, such as nickel and nickel alloy.

When the bump 9 is set in contact with the electrode pad of an object to be checked, the bump 9 is pushed against the electrode pad of the object by the elasticity of the elastic support plate 8 and/or elasticity of the conductive support and the bump 9 and electrode pad are electrically connected and, at the same time, the difference in height between the electrode pad and the bump is absorbed.

The cylindrical section 9A of the bump 9 can be made of the same conductive metal as that of the elastic support plate 8. The frusto-pyramidal section 9B can be made of a conductive material, such as tungsten carbide, harder than the electrode pad of the object to be checked. The surface of the probe terminal 4 can be covered with a better conductive metal, such as gold, rhodium or alloy of these.

As shown in FIGS. 7 and 8, a latching member 12 is provided on the first substrate 2. The latching member 12, when being set in contact with the electrode pad of the object to be checked, is prevented from being pushed by the electrode pad to a more than necessary extent. That is, as indicated by a dash-dot line in FIG. 8, when the probe terminal is pushed by the electrode pad of the object and the elastic support plate 8 is pushed down, the elastic support plate 8 is latched by the latching member 12, preventing the elastic support plate 8 from being pushed down to an unnecessary extent and being injured.

Although the latching member 12 is provided in a position under the bump 9, this position can be determined, taking into consideration the elasticity, etc., of the elastic support plate 8. By forming the latching member in a fence-or wall-like configuration, one latching member 12 can latch the free ends of a plurality of elastic support plates simultaneously which are arranged vertically. The latching member 12 can be made not fence-like but as a plurality of column-like members.

As shown in FIG. 8, a second substrate 11 is connected to the rear surface of the first substrate 2 through an elastic connection member 10. The elastic connection member 10 can be made of, for example, a gold alloy, etc., to have a ribbon-like configuration. The second substrate 11 can be comprised of a printed wiring board, such as a performance board. The electrode pad of the object to be checked is connected to a tester T (see FIG. 10) through the contact terminal 9, elastic support plate 8 and conductive support 7 in the probe terminal 4, and first electrode 3, second electrode 5, elastic connection member 10 and third electrode 11A on the second substrate 11. The ribbon-like elastic connection member 10 has a bent surface 10A in the same Figure. The bent surface is connected to the second electrodes 5 arranged at the peripheral edge portion 2B of the rear surface of the first substrate 2 and the other end of the bent surface is connected to the electrode 11A on the second substrate 11. The surface of the elastic connection member 10 can be formed of a conductive metal film of elasticity and toughness, such as nickel and nickel-cobalt alloy and is automatically welded to the second electrode 5 by a bonding apparatus.

A method for manufacturing a contactor 1 of the present embodiment by an LIGA (Lithographie, Galvanoformung, Abformung) process will be explained below while referring to, for example, FIGS. 11 and 12. The process of FIGS. 11A to 12C is the same as the process of FIGS. 3A to 4C and an explanation is omitted here.

Figure 12A:
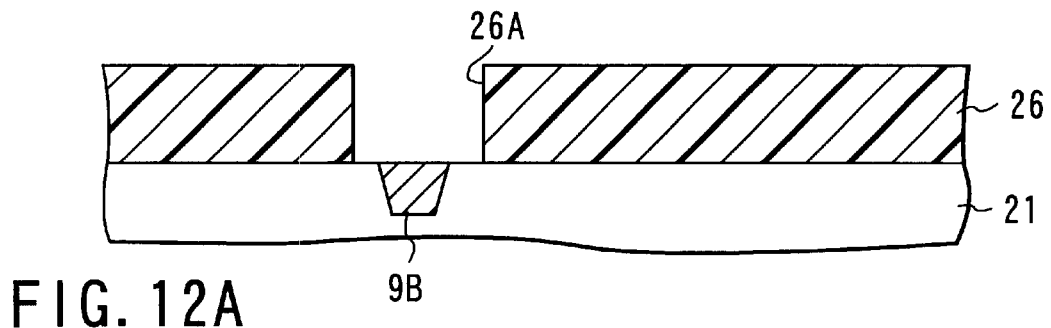
FIGS. 12A, 12B, 12C and 12D are views showing the steps of manufacturing a portion other than the bump portion of the probe terminal shown in FIG. 8.
Figure 12B:
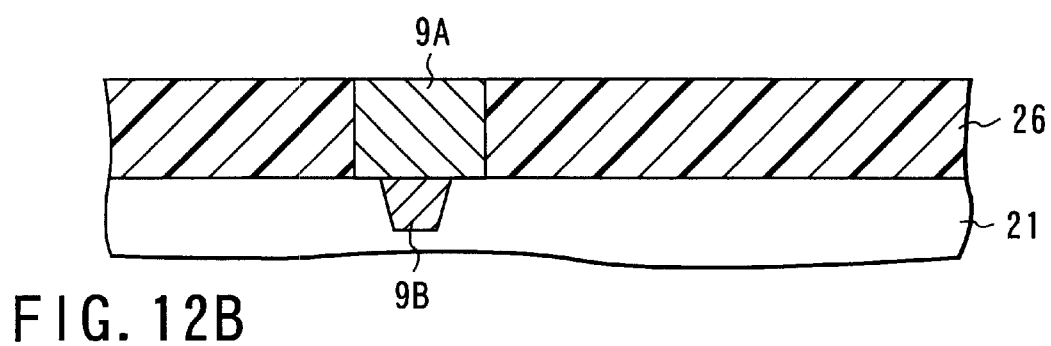
Figure 12C:
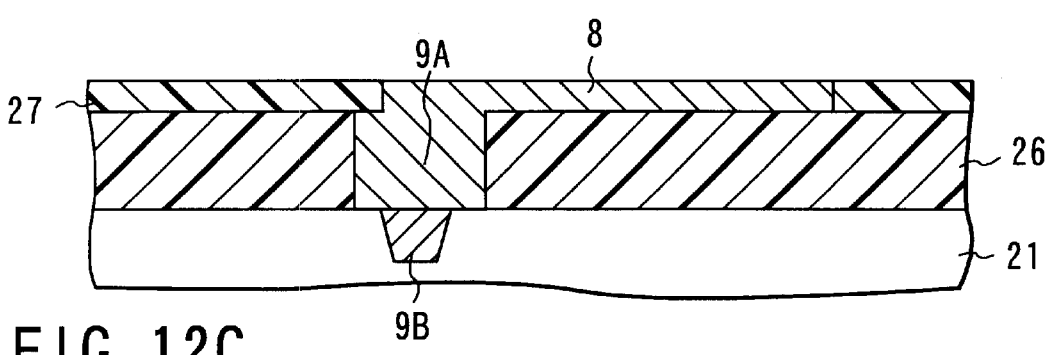
Figure 12D:
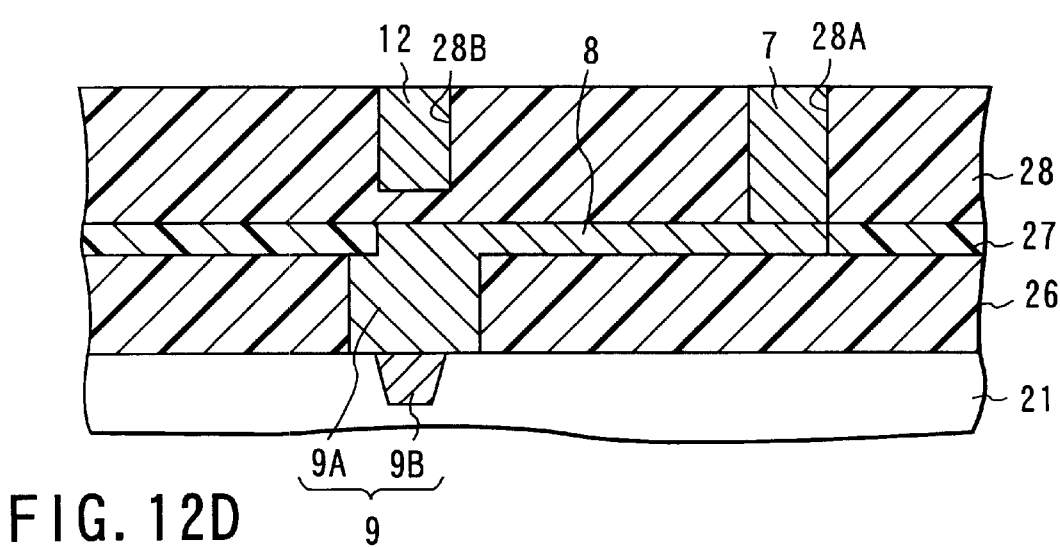

With reference to FIG. 12C, a cantilever spring 8 of a nickel alloy is formed in a recess of a sacrificial layer 27 in a form integral with a cylindrical section 9A. In FIG. 12D, a sacrificial layer 28 of the same resin as a sacrificial layer 26 is preferably formed by a similar process to FIG. 12C. A cylindrical hole 28A and groove 28B corresponding to a latching member 12 are formed in the sacrificial layer 28. The sacrificial layer 28 is masked while leaving the groove 28B. By burying the groove 28B with a predetermined material, the latching member 12 is formed. As this material use can be made of, for example, polysilicon. By burying a cylindrical hole 28A with a predetermined material by the electroforming process, a conductive support 7 is formed. As this material use may be made of, for example, a nickel alloy. By the steps above, a probe terminal 4 and latching member 12 are formed in the sacrificial layers 26, 27 and 28 over the surface of a substrate (silicon substrate) 21.

This substrate 21 is joined to a first substrate (silicon substrate) 2 for the contactor. The conductive support 7 is connected to the first electrode 3 on the first substrate 2 and both substrates 2, 21 are formed as an integral unit. At this time, the latching member 12 is fixed to the first substrate in a state adjacent to the first electrode 3. Then, by a process with a hydrofluoric acid, etc., the probe terminal 4 is separated from the sacrificial layers 26, 27 and 28.

By the bonding apparatus, the elastic connection member 10 is connected to the second electrode 5 (see FIG. 8) formed on the rear surface of the first substrate 2. A predetermined material is coated on the rear surface of the first substrate 2 and a sacrificial layer with an elastic connection member 10 buried therein is formed. As this material use may made of, for example, wax.

By polishing the surface of the sacrificial layer the free end portion of the elastic connection member 10 is adjusted to the same height. The elastic connection member is connected to the third electrode 11A on the second substrate (printed wiring board) 11 and the second substrate 11 and first substrate 2 are formed as an integral unit. Then, by removing the sacrificial layer a contactor 1 connected to the second substrate (printed wiring board) 11 is manufactured.

With reference to FIG. 10, the operation of the contactor 1 will be explained below in the case where the contactor 1 is mounted on a probe apparatus for checking the electrical characteristic of a plurality of chips on a wafer. Within the probe apparatus, an object (wafer) W to be checked is placed on a stage 30. The stage is movable in the X, Y, Z and θ directions and is moved to under the contactor 1. By this movement, an aligning operation is effected by the aligning mechanism (not shown) to align the position of the respective probe terminal 4 with the position of the respective electrode pad of the wafer.

By lifting the stage 30, the electrode pads of a plurality of chips on the wafer W are contacted at a time with the probe terminals 4 of the contactor 1. Here, the number of the IC chips to be contacted at a time can include all the IC chips formed on the wafer W or given chips thereof. The stage 30 is further overdriven in the Z direction to cause the electrode pads of the IC chips to push the contact terminals 9 of the probe terminals 4. Even if the heights of the IC chips are not uniform, the cantilever springs 8 and, further, conductive supports 7 are elastically deformed in accordance with the heights of the respective pads. By this deformation, the difference in height among the respective pads is absorbed. The probe terminals (bumps) 9 of the probe terminals 4 enter into the electrode pads under an above-mentioned pushing force. By doing so, the probe terminals of the probe terminals 4 are set in better electrical contact with the electrode pads of the IC chips and the IC chips formed on the wafer W are positively connected to the tester T. At this time, as indicated by a dash-dot line in FIG. 8, the latching member 12 prevents the elastic support plate (cantilever spring) 8 from being excessively elastically deformed toward the first substrate 2 side and from being damaged.

By lowering the stage 30 followed by moving in the X-direction or in the Y direction, the wafer is index-fed. In this position, the following 16 or 32 IC chips are checked.

According to the present embodiment, as set out above, the probe terminal 4 has the first electrode 3 arranged on the surface of the first substrate (silicon substrate) 2, conductive supports 7 provided on the respective first electrode 3 and having a predetermined aspect ratio, elastic support plate (cantilever spring) 8 supported at its one end on the upper end of the conductive supports 7, and bump 9 fixed on the elastic support plate 8. By such a structure, a narrow pitch can be achieved on the object to be checked in the present invention or the probe terminals 4 can be freely arranged even relative to a plurality of electrode pads arranged at a plurality of arrays.

The material of the probe terminal is made the same as a material of the object to be checked or is made near in thermal expansion coefficient to the object to be checked. By doing so, even if the object generates heat during checking, any positional displacement between all the contact terminals 9 and the electrode pads can be prevented and both can be contacted accurately and positively.

The difference in height among the electrode pads resulting from the warp, etc., of the wafer is absorbed by the elasticity of the elastic support plate (cantilever spring) 8 and elastic supports 7, so that it is possible to improve the contactability between the contact terminal 9 and the electrode pad. As a result, it is possible, according to the present invention, to make checking with high accuracy.

By adopting the second substrate 11 (printed wiring board such as a performance board) and elastic connection member 10 as the electrical connection means relative to an external measuring apparatus, the contactor of the present embodiment absorbs a warp generated in the object to be checked, thus providing added contactability to the contactor 1.

By providing the latching member 12 below the free end of the elastic support plate 8, it is possible to prevent the elastic support plate 8 from being excessively elastically deformed and to prevent a damage to the elastic support plate.

Further, it is possible to automatically perform the mounting of the probe terminals 4 on the silicon substrate 2.

What is claimed is:

1. A contactor comprising:

a first substrate;

a plurality of first electrodes arranged on one surface of the first substrate;

a plurality of probe terminals respectively provided on the first electrodes and making electrical contact with each of a plurality of checking electrodes of an object to be checked, the respective probe terminal having at least one conductive support mounted upright on the respective first electrode with a predetermined aspect ratio, a conductive elastic support plate whose one end is fixed to an end of the conductive support which is opposite to the first electrode, and a contact terminal provided on the other end of the elastic conductive support plate;

a plurality of second electrodes arranged on the other surface of the first substrate;

a first connection line electrically connecting, in the first substrate, each of the first electrodes to each of the second electrodes; and elastic electrical connection means connecting the respective second electrode to a testing apparatus.

2. A contactor according to claim 1, wherein an aspect ratio of the conductive support is 2 to 20.

3. A contactor according to claim 1, wherein the conductive support is comprised of a structure of a triangular prism.

4. A contactor according to claim 1, wherein the elastic support plate has two plates arranged in a spaced-apart way and a connection plate connecting together one-end sides of these two plates, those free end portions of the two plates of the elastic support plate which are not connected by the connection plate are fixed to the conductive supports, and a contact terminal is provided at a substantially middle of the connection plate of the elastic support plate.

5. A contactor according to claim 1, wherein the elastic support plate has a substantially square frame-like plate and a bridge-like plate provided on a diagonal line of the square frame-like plate, the frame-like plate is fixed to the conductive support at corners of the diagonal line, and the contact terminal is provided at a substantially middle of the bridge-like plate.

6. A contactor according to claim 1, wherein the elastic support plate has a substantially square frame-like plate and two cantilever-like beams extending from two corners on a diagonal line of the frame and having free ends facing each other in a spaced-apart way, the frame-like plate is fixed to the conductive supports at the corners of the diagonal line, and two contact terminals are provided such that the free ends of the cantilever-like beams are arranged opposite to each other with a spacing provided.

7. A contactor according to claim 1, wherein the electrical connection means connecting each of the second electrodes to a testing apparatus has a second substrate, and third electrodes provided on one surface of the second substrate and elastically and electrically contacted with the second electrodes.

8. A contactor according to claim 7, wherein the second substrate is comprised of a printed wiring board.

9. A contactor according to claim 1, wherein the plurality of first electrodes are arranged at a central area of one surface of the first substrate.

10. A contactor according to claim 1, wherein the plurality of first electrodes are so provided as to correspond to all of a plurality of checking electrodes of the object to be checked.

11. A contactor according to claim 1, wherein the plurality of second electrodes are arranged at a peripheral area on the other surface of the first substrate.

12. A contactor according to claim 1, wherein the contact terminal is comprised of a bump having a flat surface at a forward end and gradually increased in thickness from the forward end toward a base section.

13. A contactor according to claim 12, wherein the probe terminal is cylindrical in configuration.

14. A contactor comprising:

a first substrate;

a plurality of first electrodes arranged on one surface of the first substrate;

a plurality of probe terminals respectively provided on the first electrodes and making electrical contact with each of a plurality of checking electrodes of an object to be checked, the probe terminal having at least one conductive support mounted upright on the respective first electrode with a predetermined aspect ratio, a conductive elastic support plate whose one end is fixed to an end of the conductive support which is opposite to the first electrode, and a contact terminal provided on the other end of the conductive elastic support plate;

a latching member provided on the first substrate to restrict an access distance of the elastic support plate to the first substrate side;

a plurality of second electrodes arranged on the other surface of the first substrate;

a first connection line electrically connecting, in the first substrate, each of the first electrodes to each of the second electrodes; and elastic electrical connection means connecting each of the second electrodes to a testing apparatus.

15. A contactor according to claim 14, wherein the aspect ratio of the conductive support is 2 to 20.

16. A contactor according to claim 14, wherein the elastic support plate has two plates arranged in a spaced-apart way and a connection plate connecting together one end sides of these two plates, free ends of the two plates of the elastic support plate not connected by the connection plate are fixed to the conductive support, and the contact terminal is provided at a substantially middle of the connection plate of the elastic support plate.

17. A contactor according to claim 14, wherein the elastic support plate has a substantially square frame-like plate and a bridge-like plate provided on a diagonal line of the frame, the frame-like plate is fixed to the conductive supports at corners of the diagonal line, and the contact terminal is provided at a substantially middle of the bridge-like plate.

18. A contactor according to claim 14, wherein the elastic support plate has a substantially square frame-like plate and two cantilever-like beams extending from two corners on the diagonal line of the frame onto the diagonal line and having free ends arranged opposite to each other with a clearance provided, the frame-like plate is fixed to the conductive supports at corners on the diagonal line, and the two contact terminals are provided at respective free ends of the cantilever-like beams in a mutually opposite way with a spacing provided.

19. A contactor according to claim 14, wherein electrical connection means connecting each of the second electrodes to a testing apparatus has a second substrate and third electrodes provided on one surface of the second substrate and having elastic connection members elastically and electrically contacted with the second electrodes.

20. A method for manufacturing a contactor as recited in claim 1 with the use of a processing technique of coating a resist film on a predetermined surface, exposing the resist film with light, etching an exposed portion of the resist film to form an opening in the resist film, and performing a predetermined process on the opening, comprising:

the step of forming a plurality of said first electrodes on a first substrate;

the step of forming the conductive support on each of the first electrodes, as a resist in the step of forming the conductive support use being made of a transparent resist material so as to form the conductive support of a predetermined aspect ratio;

the step of forming the conductive elastic support plate whose one end is fixed to an end opposite to the first electrode side of each of the conductive supports; and the step of forming the contact terminal on the other end of the elastic support plate.

21. A method for manufacturing a contactor as recited in claim 14 with the use of a processing technique of coating a resist film on a predetermined surface, exposing the resist film with light, etching an exposed portion of the resist film to form an opening and performing a predetermined process on the opening, comprising:

the step of forming a plurality of said first electrodes on the first substrate;

the step of forming the conductive support and latching member on each of said first electrodes, as a resist material in the step of forming the conductive support and latching member use being made of a transparent resist material so as to form the conductive support of a predetermined aspect ratio;

the step of forming the conductive elastic support plate whose one end is fixed to an end opposite to the first electrode side of each of the conductive supports; and the step of forming the contact terminal on the other end of the elastic support plate.

* * * * *

UNITED STATES PATENT AND TRADEMARK OFFICE
CERTIFICATE OF CORRECTION

PATENT NO.    : 6,344,752 B1
DATED         : February 5, 2002
INVENTOR(S)   : Hagihara et al.

It is certified that error appears in the above-identified patent and that said Letters Patent is hereby corrected as shown below:

<u>Title page, Item [54] and Column 1, lines 1-2,</u>
The title should read:
-- [54]  CONTACTOR AND PRODUCTION METHOD FOR CONTACTOR --

Signed and Sealed this

First Day of October, 2002

*Attest:*

JAMES E. ROGAN
*Attesting Officer*    *Director of the United States Patent and Trademark Office*